United States Patent
Tetsuka et al.

(10) Patent No.: US 10,643,825 B2
(45) Date of Patent: May 5, 2020

(54) PARTICLE GENERATION PREVENTING METHOD AND VACUUM APPARATUS

(71) Applicant: Tokyo Electron Limited, Tokyo (JP)

(72) Inventors: Takashi Tetsuka, Miyagi (JP); Hiroshi Nagaike, Miyagi (JP); Masatomo Kita, Miyagi (JP); Chihiro Sato, Miyagi (JP); Naoya Suenaga, Miyagi (JP)

(73) Assignee: Tokyo Electron Limited, Tokyo (JP)

(*) Notice: Subject to any disclaimer, the term of this patent is extended or adjusted under 35 U.S.C. 154(b) by 35 days.

(21) Appl. No.: 16/151,475

(22) Filed: Oct. 4, 2018

(65) Prior Publication Data

US 2019/0108987 A1    Apr. 11, 2019

(30) Foreign Application Priority Data

Oct. 6, 2017  (JP) .................................. 2017-195755
Sep. 13, 2018  (JP) .................................. 2018-171641

(51) Int. Cl.
    *H01J 37/32*    (2006.01)
(52) U.S. Cl.
    CPC .. *H01J 37/32825* (2013.01); *H01J 37/32449* (2013.01); *H01J 37/32532* (2013.01); *H01J 37/32697* (2013.01); *H01J 37/32477* (2013.01); *H01J 37/32871* (2013.01)
(58) Field of Classification Search
    CPC ........... H01J 37/32825; H01J 37/32449; H01J 37/32532; H01J 37/32697; H01J 37/32477; H01J 37/32871
    USPC ......................................................... 34/402
    See application file for complete search history.

(56) References Cited

U.S. PATENT DOCUMENTS

| | | | | |
|---|---|---|---|---|
| 5,494,713 A | * | 2/1996 | Ootuki | ...................... C23C 8/36 427/579 |
| 5,507,874 A | * | 4/1996 | Su | ......................... B08B 7/0035 134/1 |
| 5,565,034 A | * | 10/1996 | Nanbu | .............. H01L 21/67173 118/668 |
| 5,953,832 A | * | 9/1999 | Rosynsky | ............ B01J 37/0215 34/403 |
| 6,033,483 A | * | 3/2000 | Demaray | ............ C23C 14/3407 118/733 |
| 6,073,577 A | * | 6/2000 | Lilleland | ........... H01J 37/32009 118/723 E |

(Continued)

FOREIGN PATENT DOCUMENTS

| | | | | |
|---|---|---|---|---|
| EP | 3106956 A1 | * | 12/2016 | ........ H01J 37/32009 |
| JP | 2002-141291 | | 5/2002 | |

(Continued)

*Primary Examiner* — Stephen M Gravini
(74) *Attorney, Agent, or Firm* — IPUSA, PLLC (57) ABSTRACT

A particle generation preventing method for preventing particle generation in a vacuum apparatus including an alumite-treated component is provided. The particle generation preventing method includes an evacuation step of evacuating the vacuum apparatus to reduce a pressure within the vacuum apparatus to less than or equal to $1.3 \times 10^{-1}$ Pa (1 mTorr), a pressure increasing step of increasing the pressure within the vacuum apparatus to atmospheric pressure after the evacuation step, and a moisture adhesion step of causing moisture to be adhered to the alumite-treated component after the pressure increasing step.

13 Claims, 7 Drawing Sheets

(56) References Cited

U.S. PATENT DOCUMENTS

| | | | | |
|---|---|---|---|---|
| 7,628,931 | B2* | 12/2009 | Saito | H01J 37/3244 |
| | | | | 118/715 |
| 7,877,895 | B2* | 2/2011 | Otsuka | H01L 21/67748 |
| | | | | 118/725 |
| 8,104,428 | B2* | 1/2012 | Honda | C23C 16/4401 |
| | | | | 118/715 |
| 8,181,356 | B2* | 5/2012 | Otsuka | H01L 21/67748 |
| | | | | 118/720 |
| 8,877,002 | B2* | 11/2014 | Mitsuhashi | C23C 16/4404 |
| | | | | 118/715 |
| 9,127,882 | B2* | 9/2015 | Jenkins | D06F 58/28 |
| 9,171,714 | B2* | 10/2015 | Mori | H01L 21/0206 |
| 9,879,908 | B2* | 1/2018 | Triglia, Jr. | F26B 3/347 |
| 10,229,844 | B2* | 3/2019 | Sawachi | H01J 37/32009 |
| 10,393,375 | B2* | 8/2019 | Malavasi | F23L 7/007 |
| 2002/0187271 | A1* | 12/2002 | Demaray | C23C 14/3407 |
| | | | | 427/402 |
| 2012/0037314 | A1* | 2/2012 | Endoh | H01J 37/32477 |
| | | | | 156/345.34 |
| 2012/0216955 | A1* | 8/2012 | Eto | C23C 16/4404 |
| | | | | 156/345.51 |
| 2018/0374679 | A1* | 12/2018 | Ito | H01J 37/32027 |
| 2019/0080888 | A1* | 3/2019 | Ikenaga | H01J 37/32449 |
| 2019/0108987 | A1* | 4/2019 | Tetsuka | H01J 37/32825 |

FOREIGN PATENT DOCUMENTS

| | | | | |
|---|---|---|---|---|
| JP | 2008-305953 | | 12/2008 | |
| JP | 4987911 | B2 * | 8/2012 | ......... C23C 16/4404 |
| JP | 6512959 | B2 * | 5/2019 | ........... G05D 7/0635 |
| KR | 20040048343 | A * | 6/2004 | ........ H01J 37/32477 |

* cited by examiner

PARTICLE GENERATION PREVENTING METHOD AND VACUUM APPARATUS

CROSS-REFERENCE TO RELATED APPLICATION

The present application is based on and claims priority to Japanese Patent Application No. 2017-195755 filed on Oct. 6, 2017 and, Japanese Patent Application No. 2018-171641 filed on Sep. 13, 2018, the entire contents of which are hereby incorporated by reference.

BACKGROUND OF THE INVENTION

1. Field of the Invention

The present invention relates to a particle generation preventing method.

2. Description of the Related Art

The amount of particles generated in a vacuum apparatus is correlated with the amount of moisture in the vacuum apparatus. In this respect, techniques are known for reducing the generation of particles during processing by reducing the amount of moisture in the vacuum apparatus. For example, Japanese Unexamined Patent Publication No. 2008-305953 describes a technique that involves repeating the processes of depressurizing a vacuum process chamber, introducing an inert gas into the vacuum process chamber, and then depressurizing the vacuum processing chamber once again to reduce the amount of moisture in the vacuum apparatus.

SUMMARY OF THE INVENTION

One aspect of the present invention is directed to providing a technique for preventing particle generation in a vacuum apparatus.

According to one embodiment of the present invention, a particle generation preventing method for preventing particle generation in a vacuum apparatus including an alumite-treated component is provided. The particle generation preventing step includes an evacuation step of evacuating the vacuum apparatus to reduce a pressure within the vacuum apparatus to less than or equal to $1.3 \times 10^{-1}$ Pa (1 mTorr), a pressure increasing step of increasing the pressure within the vacuum apparatus to atmospheric pressure after the evacuation step, and a moisture adhesion step of causing moisture to adhere to the alumite-treated component after the pressure increasing step.

DESCRIPTION OF THE PREFERRED EMBODIMENTS

In the following, embodiments of the present invention will be described with reference to the accompanying drawings. Note that in the present specification and the drawings, elements that are substantially identical are given the same reference numerals and overlapping descriptions may be omitted as appropriate.

Experiments conducted by the inventors of the present invention revealed that the generation of particles in a vacuum apparatus including an alumite-treated component (hereinafter also referred to as "alumite component") cannot be adequately prevented by merely repeating the processes of introducing an inert gas and reducing the pressure within the vacuum apparatus. It has also been found that preventing particle generation is particularly difficult to achieve in a newly shipped vacuum apparatus. In view of the above findings, an aspect of the present invention is directed to providing a technique for preventing particle generation in a vacuum apparatus.

[Semiconductor Manufacturing Apparatus Overall Configuration]

First, an example configuration of a semiconductor manufacturing apparatus 10 according to an embodiment of the present invention will be described with reference to FIG. 1. The semiconductor manufacturing apparatus 10 shown in FIG. 1 is a cluster tool (multi-chambered apparatus) including a vacuum transfer module VTM and process modules PM as examples of vacuum apparatuses.

Figure 1:
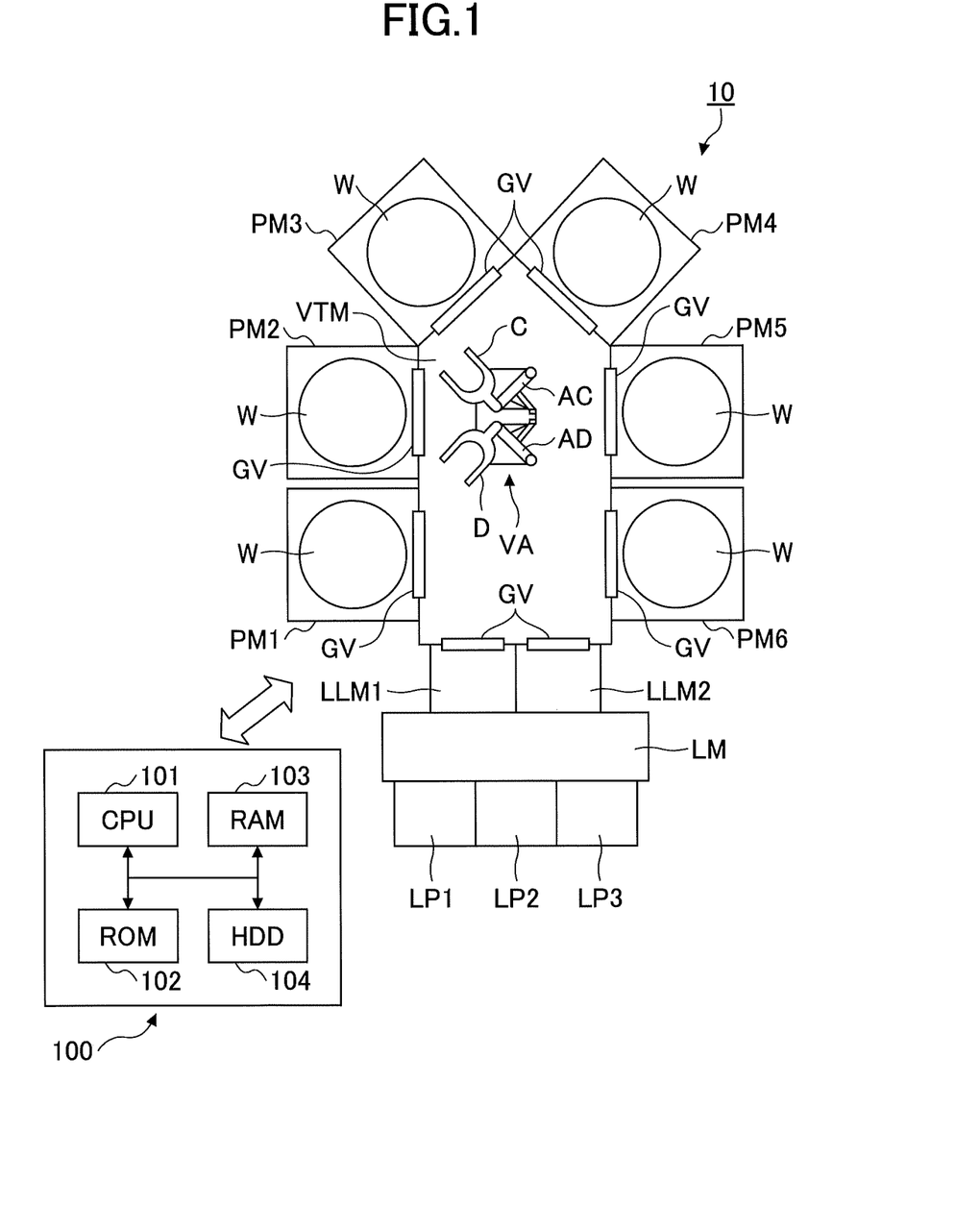
FIG. 1 is a diagram showing an example overall configuration of a semiconductor manufacturing apparatus according to an embodiment of the present invention.

The semiconductor manufacturing apparatus 10 of FIG. 1 includes process modules PM1 to PM6, the vacuum transfer module VTM, load lock modules LLM1 and LLM2, a loader module LM, and load ports LP1 to LP3.

The semiconductor manufacturing apparatus 10 is controlled by a control unit 100 and performs predetermined processes on a semiconductor wafer W (hereinafter also referred to as "wafer W") corresponding to an example of a substrate.

The process modules PM1 to PM6 are arranged adjacent to the vacuum transfer module VTM. Note that in the present description, the process modules PM1 to PM6 may be generically referred to as process module(s) PM. The process modules PM1 to PM6 and the vacuum transfer module VTM communicate with each other by opening/closing a gate valve GV. The process modules PM1 to PM6 are examples of substrate process modules that are evacuated to a predetermined vacuum atmosphere to perform predetermined processes such as etching, film deposition, cleaning, and/or ashing on a wafer W.

The vacuum transfer module VTM is an example of a transfer module that includes a transfer apparatus VA for transferring a wafer W arranged therein. The transfer apparatus VA includes two robot arms AC and AD that are bendable and rotatable. The robot arms AC and AD respectively have picks C and D attached to their tip portions. The transfer apparatus VA can hold a wafer W in each of the picks C and D and can transfer the wafer W into/out of the process modules PM1 to PM6 and the vacuum transfer module VTM as the gate valves GV between the process modules PM and the vacuum transfer module VTM are opened/closed. The transfer apparatus VA can also load/unload a wafer W into/out of the vacuum transfer module VTM and the load lock modules LLM1 and LLM2 as the gate valves GV between the vacuum transfer module VTM and the load lock modules LLM1 and LLM2 are opened/closed.

The load lock modules LLM1 and LLM 2 are arranged between the vacuum transfer module VTM and the loader module LM. The load lock modules LLM1 and LLM2 can switch between ambient air atmosphere and vacuum atmosphere to transfer a wafer W from the loader module LM corresponding to the ambient air side to the vacuum transfer module VTM corresponding to the vacuum side or transfer a wafer W from the vacuum transfer module VTM corresponding to the vacuum side to the loader module LM corresponding to the ambient air side, for example.

The loader module LM includes load ports LP1 to LP3. For example, a FOUP (Front Opening Unified Pod) accommodating twenty five (25) wafers W or an empty FOUP may be placed in each of the load ports LP1 to LP3. The loader module LM transfers a wafer W unloaded from the FOUP placed in one of the load ports LP1 to LP3 to one of the load lock modules LLM1 and LLM2, and transfers a wafer W unloaded from one of the load lock modules LLM1 and LLM2 to one of the FOUPs.

The control unit 100 includes a CPU (Central Processing Unit) 101, a ROM (Read-Only Memory) 102, a RAM (Random Access Memory) 103, and a HDD (Hard Disk Drive) 104. The control unit 100 is not limited to having the HDD 104 as a storage area and may have some other storage area such as an SSD (Solid State Drive), for example. Storage areas such as the HDD 104 and the RAM 103 store recipes that define predetermined process procedures, process conditions, transfer conditions, and the like.

The CPU 101 controls processing of the wafer W in the process module PM and controls transfer of the wafer W based on a recipe. The CPU 101 also implements evacuation control and particle measurement control according to the present embodiment. The HDD 104 or the RAM 103 may store programs for executing a substrate transfer process, a cleaning process, an evacuation control process, and the like, for example. These programs may also be stored in a storage medium or may be provided from an external device via a network, for example.

Note that the number of process modules PM, the number of load lock modules LLM, and the number of load ports LP are not limited to the corresponding numbers included in the illustrated semiconductor manufacturing apparatus 10 according to the present embodiment as long at least one of each is included.

[Process Module Configuration]

Figure 2:
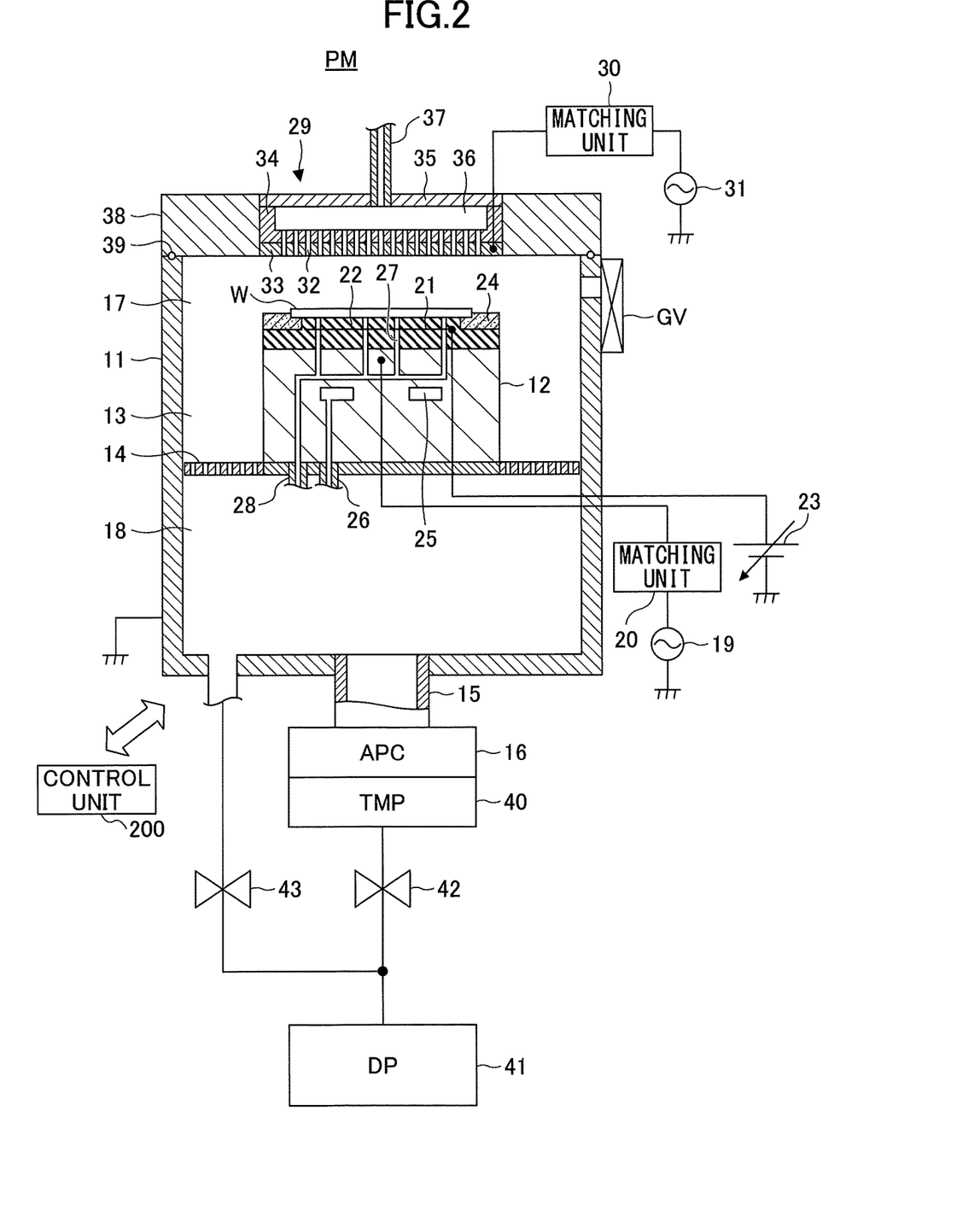
FIG. 2 is a cross-sectional view showing an example configuration of a process module according to an embodiment of the present invention.

In the following, an example configuration of the process module PM according to an embodiment of the present invention will be described with reference to FIG. 2. The process module PM according to the present embodiment corresponds to an apparatus that generates a plasma in a vacuum chamber 11 and uses the action of the plasma to perform plasma processing such as etching on the wafer W.

The process module PM includes the vacuum chamber 11 that is cylindrical in shape and is capable of being hermetically sealed. The vacuum chamber 11 is connected to ground potential. The vacuum chamber 11 may be made of aluminum and its surface may be alumite-treated, for example. At least a part of the process module PM and/or its internal components constitutes an alumite component including an alumite-treated member or part. An alumite component is a component that has been subjected to an alumite treatment, which involves anodizing the surface of an aluminum member to form an aluminum oxide ($Al_2O_3$) film on the aluminum surface. An example of an alumite component includes an aluminum evacuation plate 14 that has been subjected to an alumite treatment. The vacuum chamber 11 may also be an example of an alumite component in a case where its inner walls are alumite-treated, for example.

Also, the vacuum chamber 11 communicates with the vacuum transfer module VTM by opening/closing the gate valve GV. The vacuum chamber 11 has a pedestal 12 arranged therein that is made of a conductive material such as aluminum. The pedestal 12 is a cylindrical table on which the wafer W is placed and also serves as a lower electrode. An evacuation path 13 is formed between the side wall of the vacuum chamber 11 and the side surface of the pedestal 12 for evacuating gas above the pedestal 12 to the exterior of the vacuum chamber 11. The evacuation plate 14 is arranged in the evacuation path 13. The evacuation plate 14 is a plate member having a large number of holes and serves as a partition plate for partitioning the vacuum chamber 11 into an upper portion and a lower portion. The upper portion of the vacuum chamber 11 partitioned by the evacuation plate 14 constitutes a reaction chamber 17 in which plasma processing is performed.

Also, an evacuation chamber (manifold) 18 constituting the lower portion of the vacuum chamber 11 is connected to an evacuation pipe 15 for evacuating gas within the vacuum chamber 11 to the exterior. An adaptive pressure control (APC) valve 16 is connected to the evacuation pipe 15. The evacuation plate 14 captures or reflects plasma generated in the reaction chamber 17 and prevents the plasma from leaking into the evacuation chamber 18. A turbo molecular pump (TMP) 40 and a dry pump (DP) 41 are connected to the evacuation pipe 15 via the APC valve 16, and these pumps are used as evacuation devices for evacuating the interior of the vacuum chamber 11 to reduce the pressure within the vacuum chamber 11.

Specifically, the dry pump 41 reduces the pressure within the vacuum chamber 11 from atmospheric pressure to a medium-vacuum state (e.g., $1.3 \times 10$ Pa (0.1 Torr) or less). At this time, a valve 43 arranged at a pipe (bypass route) interconnecting the dry pump 41 and the vacuum chamber 11 is opened, and a valve 42 arranged at a pipe interconnecting the TMP 40 and the dry pump 41 is closed.

The TMP 40 cooperates with the dry pump 41 to reduce the pressure within the vacuum chamber 11 to a high-vacuum state (e.g., $1.3 \times 10^{-3}$ Pa ($1.0 \times 10^{-5}$ Torr) or less), which is a lower pressure than the medium-vacuum state. At this time, the valve 43 is closed and the valve 42 is opened.

A first radio frequency (RF) power supply 19 is connected to the pedestal 12 via a matching unit 20. For example, the first radio frequency power supply may supply a biasing radio frequency power of 400 kHz to 13.56 MHz to the pedestal 12. The matching unit 20 prevents reflection of the radio frequency power from the pedestal 12 to maximize supply efficiency of the biasing radio frequency power to the pedestal 12.

An electrostatic chuck 22 having an electrostatic electrode plate 21 arranged therein is disposed on the pedestal 12. The electrostatic chuck 22 includes a lower disk member and an upper disk member stacked on the lower disk member and having a diameter smaller than that of the lower disk member. Note that the electrostatic chuck 22 is a member made of aluminum having its upper surface thermally sprayed with ceramic or the like. When placing the wafer W on the pedestal 12, the wafer W is placed on the upper disk member of the electrostatic chuck 22.

A direct current (DC) power supply 23 is connected to the electrostatic electrode plate 21. When a positive DC voltage is applied to the electrostatic electrode plate 21, a negative potential is generated at the back surface of the wafer W (the surface of the wafer W towards the electrostatic chuck 22) such that a potential difference is created between the electrostatic electrode plate 21 and the back surface of the wafer W. In this way, the wafer W is electrostatically attracted to the upper disk member of the electrostatic chuck 22 by a Coulomb force between the electrostatic electrode plate 21 and the wafer W due to the potential difference.

Also, an annular focus ring 24 surrounding a peripheral portion of the wafer W is arranged on the electrostatic chuck 22. The focus ring 24 may be made of a conductive member such as silicon, for example. The focus ring 24 focuses plasma toward the surface of the wafer W in the reaction chamber 17 to improve etching processing efficiency.

Also, an annular coolant chamber 25 that extends in the circumferential direction may be arranged within the pedestal 12, for example. A coolant such as cooling water or Galden (registered trademark) may be supplied to the coolant chamber 25 from a chiller unit via a coolant pipe 26 and circulated within the coolant chamber 25, for example. In this way, the pedestal 12 may be cooled by the coolant circulated in the coolant chamber 25, and the wafer W and the focus ring 24 may be cooled by the pedestal 12 via the electrostatic chuck 22.

The surface of the upper disk member of the electrostatic chuck 22 onto which the wafer W is electrostatically attracted has a plurality of heat transfer gas supply holes 27. Heat transfer gas such as helium (He) gas is supplied to the plurality of heat transfer gas supply holes 27 via a heat transfer gas supply line 28. The heat transfer gas is supplied to a gap between the surface of the electrostatic chuck 22 and the back surface of the wafer W via the heat transfer gas supply hole 27. By supplying the heat transfer gas to such a gap, heat of the wafer W can be transferred to the electrostatic chuck 22.

A shower head 29 is arranged at a ceiling portion of the vacuum chamber 11 to face the pedestal 12. A second radio frequency (RF) power supply 31 is connected to the shower head 29 via a matching unit 30, and the second radio frequency power supply 31 may supply a plasma generating radio frequency power of about 40 MHz to the shower head 29, for example. That is, the shower head 29 serves as an upper electrode. The matching unit 30 prevents reflection of the radio frequency power from the shower head 29 to maximize supply efficiency of the plasma generating radio frequency power to the pedestal 12.

The shower head 29 includes a ceiling electrode plate 33 having multiple gas holes 32, a cooling plate 34 for detachably holding the ceiling electrode plate 33, and a lid plate 35 covering the cooling plate 34. A buffer chamber 36 is arranged within the cooling plate 34, and a gas introducing pipe 37 is connected to the buffer chamber 36. The shower head 29 supplies gas supplied from the gas introducing pipe 37 to the buffer chamber 36 into the reaction chamber 17 via the multiple gas holes 32.

Also, a lid 38 including the shower head 29 is detachably arranged on the upper portion of the vacuum chamber 11. A seal member 39 such as an 0 ring for sealing the periphery of the vacuum chamber 11 is arranged between the vacuum chamber 11 and the lid 38. When the lid 38 is detached from the vacuum chamber 11, an operator can directly touch the wall surface and components of the vacuum chamber 11. In this way, the operator can clean the wall surface of the vacuum chamber 11 and the surface of the component parts to remove deposits attached to the wall surface of the vacuum chamber 11 and the like.

Note that the biasing radio frequency power from the first radio frequency power supply 19 may or may not be applied in the process module PM. That is, by applying at least a plasma generating radio frequency power in the reaction chamber 17, a plasma may be generated from gas supplied from the shower head 29 and the generated plasma may be used to perform plasma processing such as etching on the wafer W.

Note that operations of the various components of the process module PM may be controlled by a control unit 200 in cooperation with the control unit 100 that controls overall operations of the semiconductor manufacturing apparatus 10, for example.

[Vacuum Transfer Module Configuration]

Figure 3:
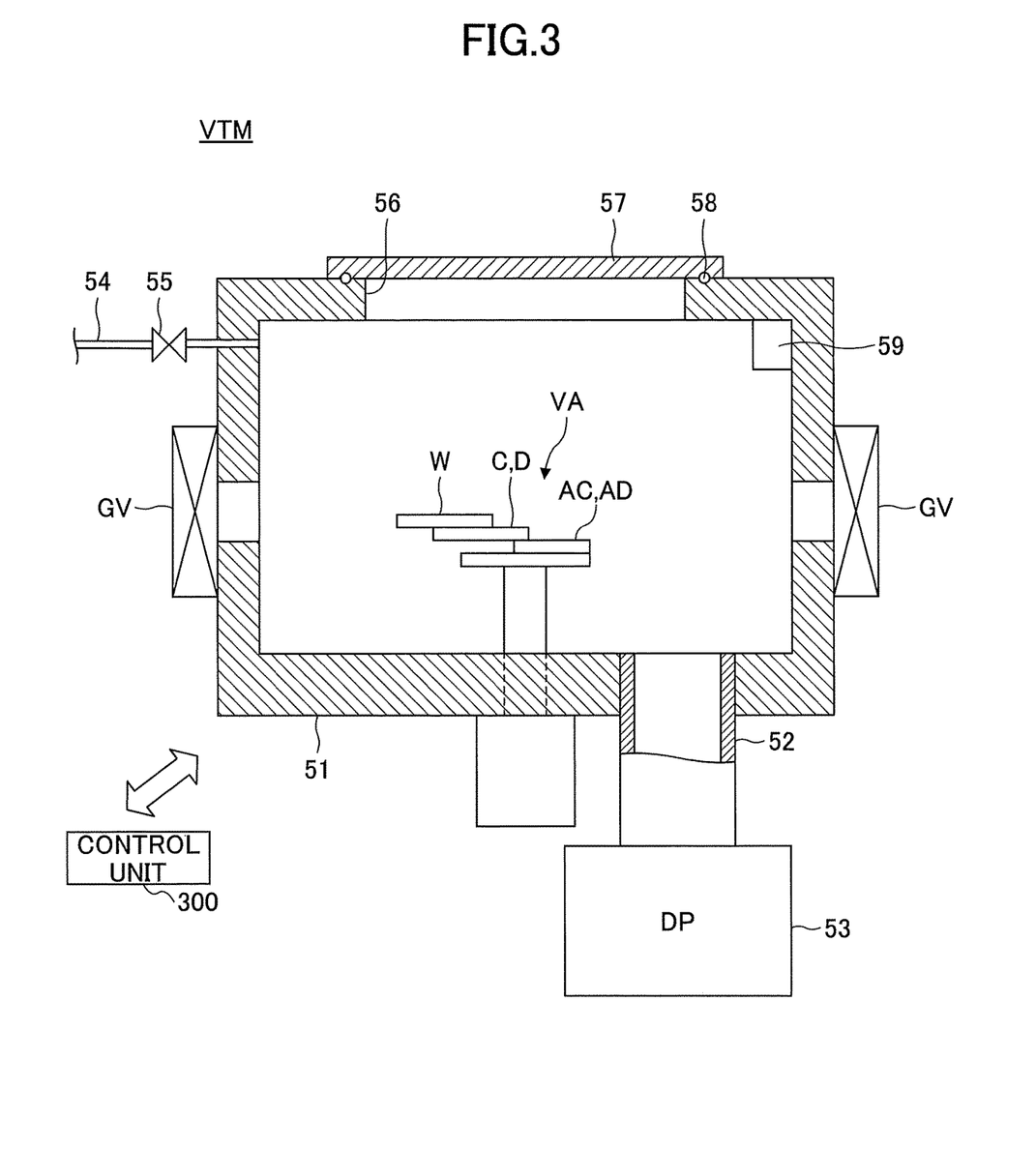
FIG. 3 is a cross-sectional view showing an example configuration of a vacuum transfer module according to an embodiment of the present invention.

In the following, an example configuration of the vacuum transfer module VTM according to an embodiment of the present invention will be described with reference to FIG. 3. The vacuum transfer module VTM according to the present embodiment is an apparatus that transfers the wafer W between the process modules PM1 to PM6 and the load lock modules LLM1 and LLM2 using the transfer apparatus VA.

The vacuum transfer module VTM includes a vacuum chamber 51 that is cylindrical in shape and is capable of being hermetically sealed. The vacuum chamber 51 is made of aluminum, and its surface may be alumite-treated, for example. The vacuum chamber 51 communicates with the process modules PM1 to PM6 by opening/closing the gate valve GV. The vacuum chamber 51 has the transfer apparatus VA arranged therein for transferring the wafer W. The transfer apparatus VA includes two robot arms AC and AD that are bendable and rotatable. The robot arm AC and the robot arm AD respectively have and picks C and D attached to their tip portions.

At least a part of the components of the vacuum transfer module VTM constitute an alumite component. For example, the robot arms AC and AD of the transfer apparatus VA that are made of aluminum may be alumite components. The vacuum chamber 51 may also be an example of an alumite component in a case where its aluminum inner walls are alumite-treated, for example.

An evacuation pipe 52 for evacuating gas in the vacuum chamber 51 to the exterior is connected to a lower portion of the vacuum chamber 51. A dry pump (DP) 53 is connected to the evacuation pipe 52, and the dry pump 53 evacuates the vacuum chamber 51 to reduce the pressure within the vacuum chamber 51. Specifically, the dry pump 53 reduces the pressure within the vacuum chamber 51 from atmospheric pressure to a medium-vacuum state (e.g., $1.3 \times 10$ Pa (0.1 Torr) or less).

A dry gas supply line 54 for supplying dry gas to the interior of the vacuum chamber 51 and a valve 55 for opening/closing the dry gas supply line 54 are arranged at a side wall of the vacuum chamber 51. By opening/closing the valve 55, dry gas can be supplied to the interior of the vacuum chamber 51. The dry gas may be dry air or an inert gas such as nitrogen ($N_2$) gas or a rare gas, for example. Note that the vacuum chamber 11 may similarly be provided with a dry gas supply line and a valve so that dry gas such as dry air may be supplied into the vacuum chamber 11, for example.

A lid 57 having an aluminum surface that is alumite-treated is arranged at a ceiling portion of the vacuum chamber 51 to cover an opening portion 56 of the vacuum chamber 51. A seal member 58 such as an O ring for sealing the periphery of the opening portion 56 is arranged between the vacuum chamber 51 and the lid 57.

The lid 57 is detachably arranged on the vacuum chamber 51, and when the lid 57 is opened, an operator can directly touch the wall surface of the vacuum chamber 51 and internal components of the vacuum chamber 51. In this way, the operator can clean the wall surface and the surfaces of the internal components of the vacuum chamber 51 to remove deposits adhered to the wall surface and the internal components of the vacuum chamber 51, for example.

Also, a quadrupole mass spectrometer (QMS) 59 is installed within the vacuum chamber 51 in order to monitor the moisture content in the vacuum chamber 51. The QMS 59 is an example of a mass spectrometer that uses a quadrupole mass filter to separate ions derived from a sample to be analyzed and sorts the ions according to their mass-to-charge ratio.

In this way, the amount of molecules existing within a space subjected to measurement can be determined. In the present example, the QMS 59 outputs an ion current proportional to the detected moisture content in the vacuum chamber 51. Note that the QMS 59 may be replaced with some other device that is capable of detecting the moisture content within the vacuum chamber 51 such as an infrared absorption/emission analysis device or an ICP (inductively coupled plasma) mass spectrometer. Also, the vacuum chamber 11 may similarly have a QMS or a similar device installed therein.

Note that operations of the various components of the vacuum transfer module VTM may be controlled by a control unit 300 in cooperation with the control unit 100 that controls the overall operations of the semiconductor manufacturing apparatus 10, for example.

[Particle Generation Preventing Method]

Figure 4:
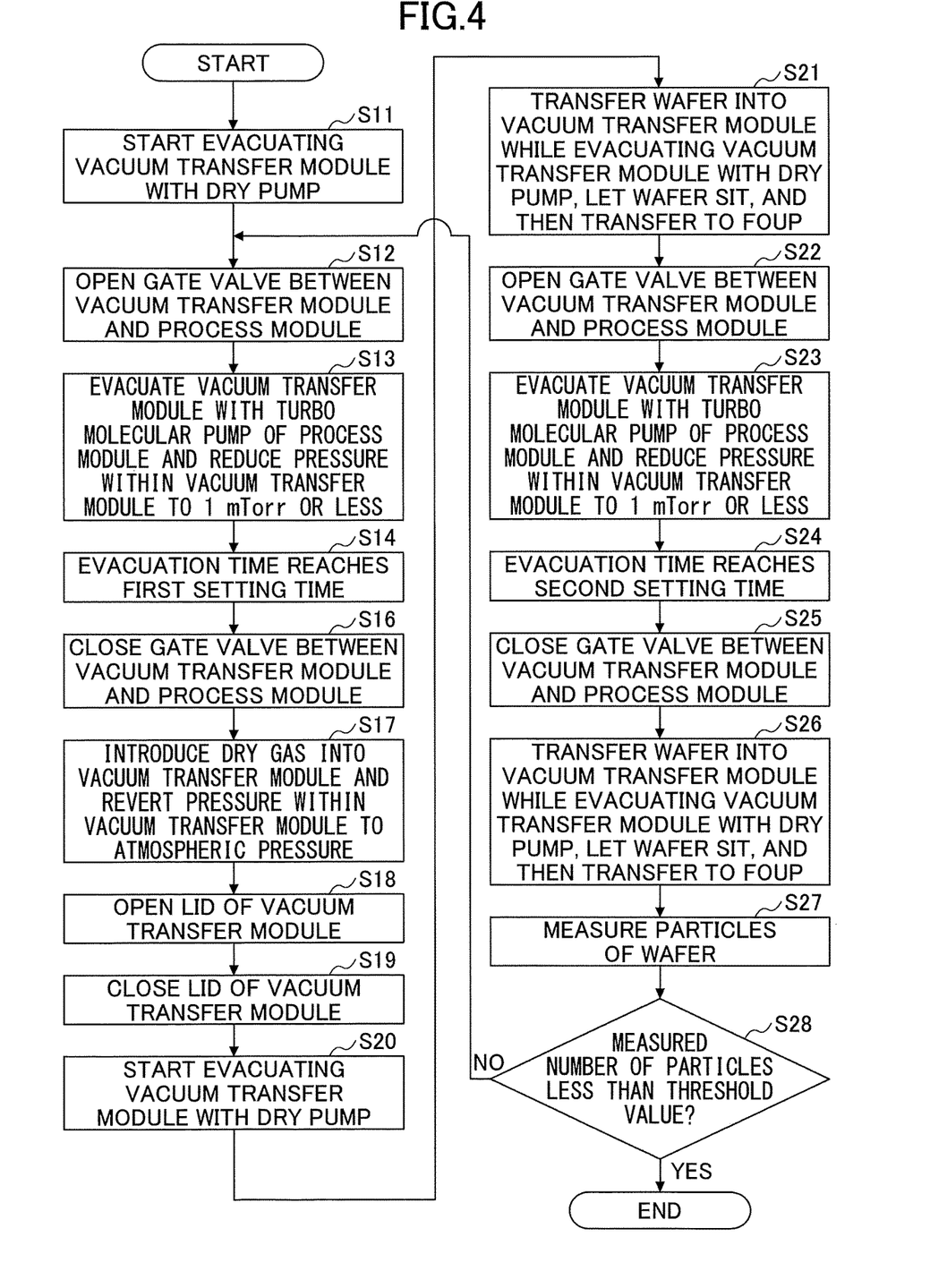
FIG. 4 is a flowchart showing an example particle generation preventing process according to an embodiment of the present invention.

In the following, a particle generation preventing method according to an embodiment of the present invention will be described with reference to FIG. 4. FIG. 4 is a flowchart showing an example particle generation preventing process according to an embodiment of the present invention. In the following description of the present embodiment, a process of preventing the generation of particles in the vacuum chamber 51 of the vacuum transfer module VTM will be described. However, the generation of particles in the vacuum chamber 11 of the process module PM may be prevented in a similar manner. The particle generation preventing process according to the present embodiment is primarily executed by the control unit 100, but the process may also be executed by the control unit 300 of the vacuum transfer module VTM or by the control unit 300 in cooperation with the control unit 100, for example.

In step S11, the control unit 100 implements control to start evacuating the vacuum chamber 51 of the vacuum transfer module VTM installed in a clean room using the dry pump 53 to reduce the pressure within the vacuum chamber 51 from atmospheric pressure to a medium-vacuum state (e.g., about $1.3 \times 10$ Pa (0.1 Torr)).

Then, the control unit 100 controls the gate valve GV between the vacuum transfer module VTM and the process module PM to open (step S12). Then, the control unit 100 evacuates the vacuum chamber 51 of the vacuum transfer module VTM using the TMP 40 of the process module PM to reduce the pressure within the vacuum chamber 51 of the vacuum transfer module VTM to $1.3 \times 10^{-1}$ Pa (1 mTorr) or less (step S13).

Note that the above step of further reducing the pressure within the vacuum chamber 51 to $1.3 \times 10^{-1}$ Pa (1 mTorr) or less using the TMP 40 of the process module PM after evacuating the vacuum chamber 51 using the dry pump 53 of the vacuum transfer module VTM is implemented for the purpose of sufficiently removing moisture contained in the alumite component included in the vacuum chamber 51 after it has been evacuated by the dry pump 53. That is, the vacuum chamber 51 of the vacuum transfer module VTM is evacuated using the TMP 40 of the process module PM so that the pressure within the vacuum chamber 51 can reach a degree of vacuum that cannot be reached using only the dry pump 53.

Then, the control unit 100 waits until the evacuation time has reached a first setting time (step S14), and then closes the gate valve GV between the vacuum transfer module VTM and the process module PM (step S16). The first setting time corresponds to the evacuation time of evacuation by the TMP 40 before introducing dry gas into the vacuum chamber 51.

Then, the control unit 100 opens the valve 55 that opens/closes the dry gas supply line 54, introduces dry gas into the vacuum chamber 51 of the vacuum transfer module VTM, and brings the pressure within the vacuum chamber 51 of the vacuum transfer module VTM back to atmospheric pressure (step S17). In this way, the lid 57 can be opened. Then, the lid 57 of the vacuum transfer module VTM is opened (step S18). By opening the lid 57, the interior of the vacuum chamber 51 is exposed to the atmosphere.

Then, the lid 57 of the vacuum transfer module VTM is closed (step S19). Then, the control unit 100 starts evacuating the vacuum transfer module VTM using the dry pump 53 (step S20). Then, while evacuating the vacuum transfer module VTM using the dry pump 53, the control unit 100 loads a wafer W into the vacuum transfer module VTM. The control unit 100 leaves the wafer W in the vacuum transfer module VTM for a certain period of time while the wafer W is held by a pick (sitting step), and the control unit 100 thereafter transfers the wafer W to the FOUP (step S21). Then, the control unit 100 controls the gate valve GV between the vacuum transfer module VTM and the process module PM to open (step S22).

Then, the control unit 100 evacuates the vacuum chamber 51 of the vacuum transfer module VTM using the TMP 40 of the process module PM to reduce the pressure within the vacuum chamber 51 of the vacuum transfer module VTM to $1.3 \times 10^{-1}$ Pa (1 mTorr) or less (step S23).

Then, the control unit 100 waits until the evacuation time has reached a second setting time (step S24) and thereafter controls the gate valve GV between the vacuum transfer module VTM and the process module PM to close (step S25).

Then, while the vacuum transfer module VTM is being evacuated by the dry pump 53, the control unit 100 leaves the wafer W in the vacuum transfer module VTM for a certain period of time and then transfers the wafer W to the FOUP (step S26). Then, the FOUP is set in a particle measuring device to measure the number of particles on the wafer W that has been left in the vacuum transfer module VTM in steps S21 and S26 (step S27). Then, a determination is made as to whether the measured number of particles is less than a threshold value (step S28). Note that the number of particles on the wafer W can be counted using a detector that detects light scattered by particles.

When the measured number of particles falls below the threshold value, it is determined that the vacuum transfer module VTM has been evacuated to a sufficient level for preventing the generation of particles and the present process is ended. On the other hand, when the measured number of particles does not fall below the threshold value, the process returns to step S12 to restart evacuation of the vacuum transfer module VTM, and the processes from steps S12 to S28 are repeated. The processes of steps S12 to S28 are repeated until it is determined that the measured number of particles is less than the threshold value. Note that the determination in step S28 may be made by the operator based on the measurement made by the particle measuring device or the determination may be made by the control unit 100.

As described above, in the particle generation preventing method according to the present embodiment, an evacuation step of evacuating the vacuum chamber 51 of the vacuum transfer module VTM for a first setting time is performed using the TMP 40 to reduce the pressure within the vacuum chamber 51 of the vacuum transfer module VTM to $1.3 \times 10^{-1}$ Pa (1 mTorr) or less and thereby adequately remove moisture contained in an alumite component included in the vacuum chamber 51. Thereafter, a pressure increasing step for increasing the pressure within the vacuum chamber 51 to atmospheric pressure is performed by introducing dry gas into the vacuum chamber 51. Then, after the pressure increasing step, an exposure step may be performed by opening the lid 57 of the vacuum chamber 51 to expose the interior of the vacuum chamber 51 to the atmosphere, for example. In this way, the generation of particles from the alumite component included in the vacuum chamber 51 of the vacuum transfer module VTM may be prevented.

Also, in the particle generation preventing method according to the present embodiment, after the moisture adhesion step (exposure step), the number of particles is measured based on a predetermined condition, and a determination is made as to whether the measured number of particles falls below a threshold value. That is, the evacuation step, the pressure increasing step, and the moisture adhesion step (exposure step) are repeated until the measured number of particles falls below the threshold value. In this way, the generation of particles in the vacuum chamber 51 may be reliably prevented. Note, however, that the sitting step and the subsequent particle measurement step do not necessarily have to be performed.

Note that the predetermined condition for measuring the number of particles in the vacuum chamber 51 after the moisture adhesion step (exposure step) may include a condition relating to evacuation after the moisture adhesion step (exposure step) and a condition relating to measurement of the number of particles in the vacuum chamber 51. An example of a condition relating to evacuation includes an evacuation time after the moisture adhesion step (second setting time). An example of a condition relating to measurement of the number of particles includes a time for leaving the wafer W in the vacuum chamber 51 (sitting time).

Figure 5:
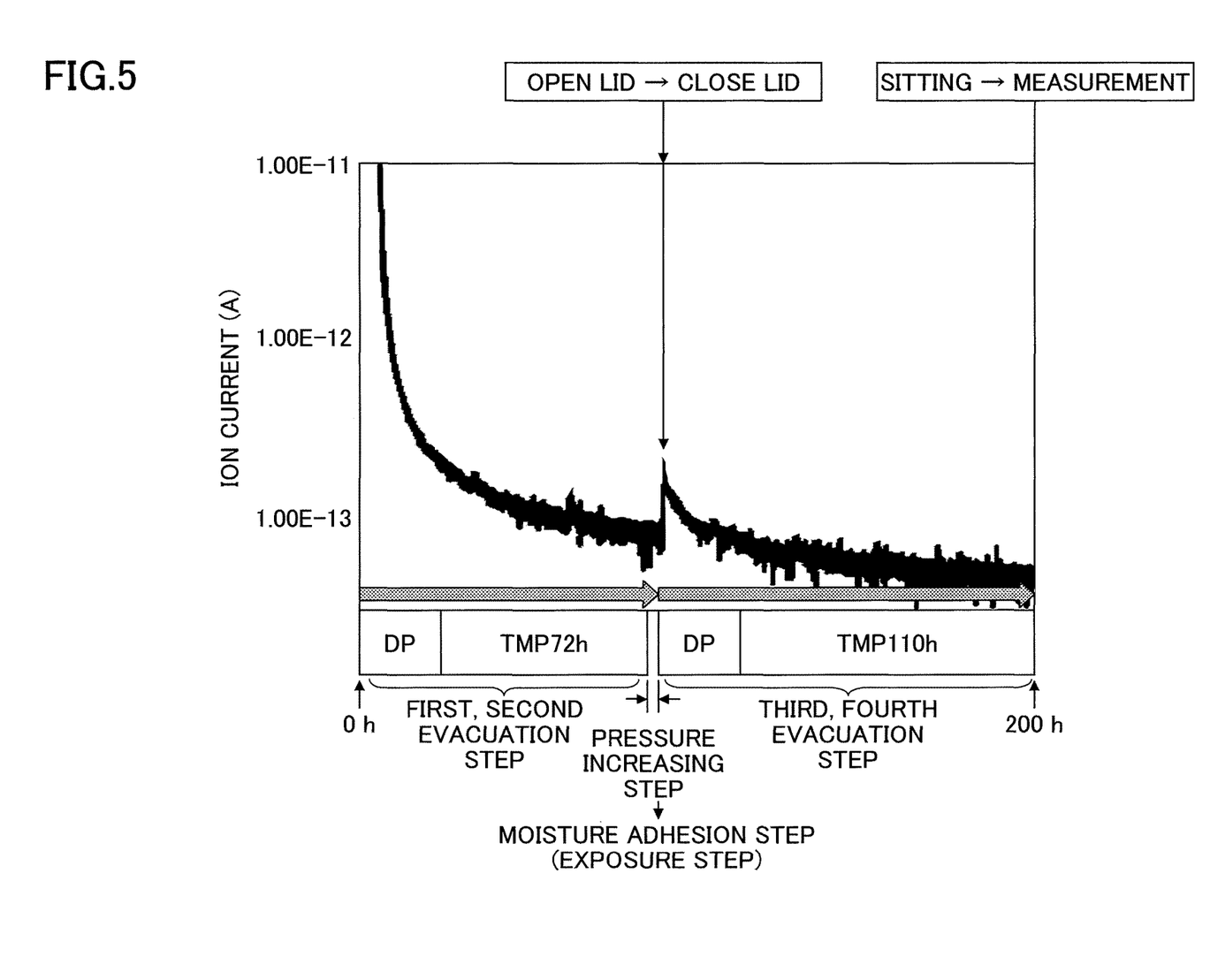
FIG. 5 is a diagram showing a relationship between evacuation time and ion current according to an embodiment of the present invention.

In the following, an example result of implementing the particle generation preventing method according to the present embodiment will be described with reference to FIG. 5. In the evacuation step, the vacuum chamber 51 was evacuated using the dry pump 53 after which the vacuum chamber 51 was evacuated using the TMP 40 for 72 hours. Then, in the pressure increasing step, a dry gas was introduced into the vacuum chamber 51 to bring the pressure within the vacuum chamber 51 back to atmospheric pressure. Then, the lid 57 was opened and closed, the vacuum chamber 51 was evacuated using the dry pump 53 after which the vacuum chamber 51 was evacuated using the TMP 40 for 110 hours, and the amount of moisture in the vacuum chamber 51 during this process was measured. The evacuation time of the second evacuation step shown in FIG. 5 is an example of the first setting time. Also, the evacuation time of the fourth evacuation step performed after opening the lid 57 is an example of the second setting time. Note that the extent to which the amount of moisture in the vacuum chamber 51 has decreased is indirectly indicated by the vertical axis in FIG. 5 that represents the ion current.

It can be appreciated from FIG. 5 that the amount of moisture in the vacuum chamber 51 continuously decreases by evacuating the vacuum chamber 51 continuously for 72 hours using the TMP 40. Thus, by adequately removing moisture within the vacuum chamber 51 in the evacuation step and the pressure increasing step, the generation of particles from the alumite component included in the vacuum chamber 51 may be prevented.

The evacuation by the TMP 40 of the process module PM (second evacuation step) is continued until the decrease in the ion current levels off (i.e., until a decrease can no longer be expected even if evacuation is continued). Note that particle measurement after the sitting step may be performed during the above evacuation step and the resulting measurement may be used to determine how long the evacuation step is to be continued, for example. Also, the measurement may be used to set up the first setting time in advance, for example. Thereafter, a dry gas is introduced into the vacuum chamber 51 to increase the pressure within the vacuum chamber 51 to atmospheric pressure (pressure increasing step) after which the lid 57 is opened (exposure step).

Although the amount of moisture (ion current amount) temporarily increases as a result of opening the lid 57, as can be appreciated, by evacuating the vacuum chamber 51 thereafter using the dry pump 53 and the TMP 40, the amount of moisture (ion current amount) that has leveled off before performing the exposure step can be reduced further.

After performing the exposure step as described above, a third evacuation step of evacuating the vacuum chamber 51 using the dry pump 53 provided in the vacuum chamber 51 of the vacuum transfer module VTM is performed. Further, after performing the third evacuations step, an opening step of opening the gate valve GV provided between the process module PM and the vacuum transfer module VTM, and a fourth evacuation step of evacuating the vacuum chamber 51 using the TMP 40 provided in the process module PM are performed.

[Number of Particles Generated in Vacuum Chamber]

In the following, an example result of measuring the number of particles under predetermined conditions (evacuation condition, sitting time) after performing the exposure step will be described with reference to FIG. 6. Note that FIG. 5 and FIG. 6 each represent results of independently executing the particle generation preventing method according to the present embodiment.

In the present example, after evacuating the vacuum chamber 51 using the dry pump 53, the number of particles generated in the vacuum chamber 51 was intermittently measured while evacuating the vacuum chamber 51 using the TMP 40. The transition in the number of particles during this time is shown in FIG. 6. Note that in FIG. 6, the horizontal axis represents the time and the vertical axis represents the transition in the number of particles in logarithmic representation. In the example of FIG. 6, the number of particles was intermittently measured at a time during a first evacuation step in which the dry pump 53 was used (DP), and at certain times after starting a second evacuation step in which the TMP 40 was used including 1 hour (TMP1h), 24 hours (TMP24h), 48 hours (TMP48h), and 96 hours (TMP96h) after starting the second evacuation step.

Figure 6:
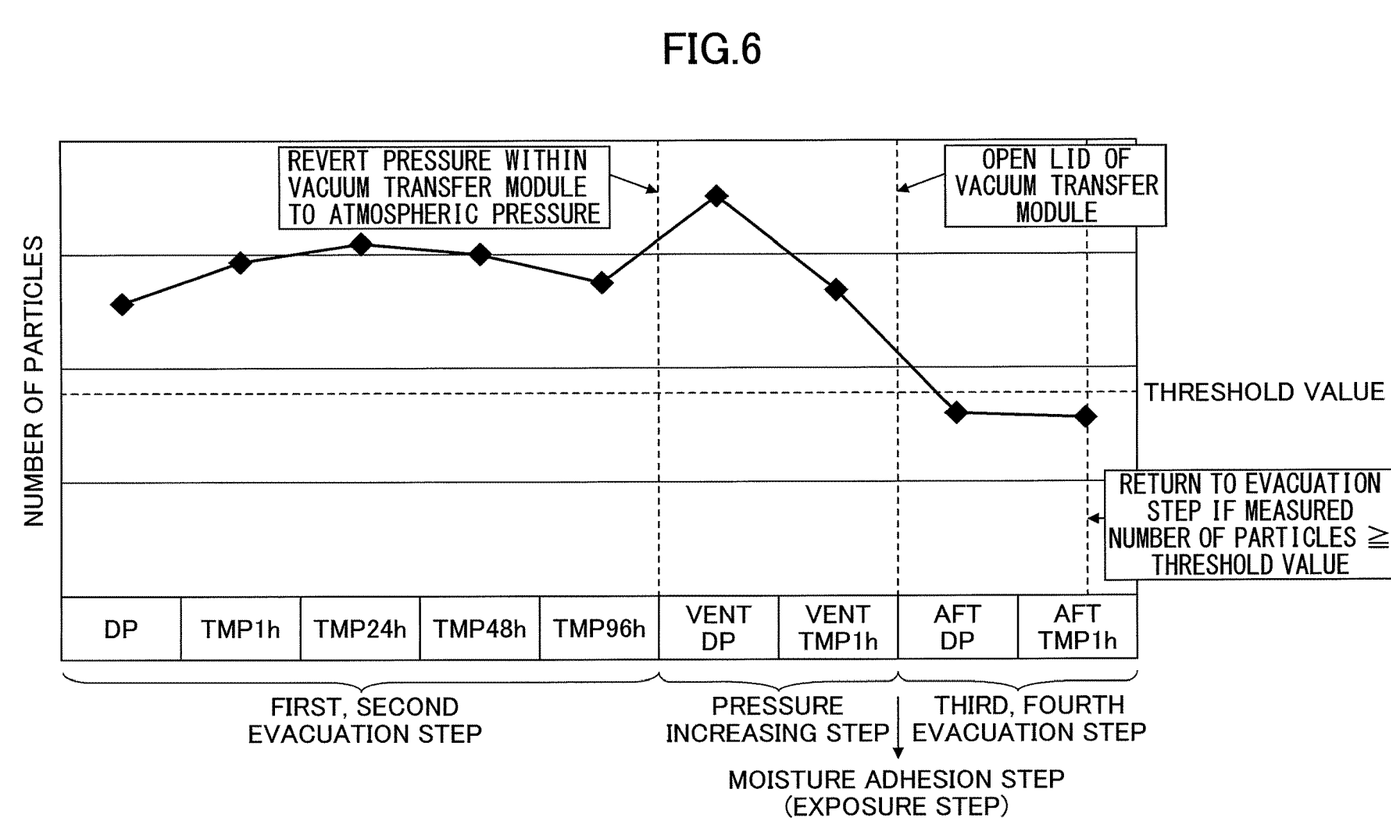
FIG. 6 is a diagram showing a transition in the number of particles generated in a vacuum chamber according to an embodiment of the present invention.

In FIG. 6, after evacuating the vacuum chamber 51 using the dry pump 53, the vacuum chamber 51 of the vacuum transfer module VTM was evacuated using the TMP 40. That is, the evacuation step includes a first evacuation step of evacuating the vacuum chamber 51 of the vacuum transfer module VTM using the dry pump 53 corresponding to an example of a first pump provided in the vacuum chamber 51 of the vacuum transfer module VTM, an opening step of opening the gate valve GV provided between the process module PM and the vacuum transfer module VTM, and a second evacuation step of evacuating the vacuum chamber 51 of the vacuum transfer module VTM using the TPM 40 corresponding to an example of a second pump provided in the process module PM.

Note that the second evacuation step is preferably performed for at least 1 hour. As can be appreciated, from DP to TMP1h in FIG. 6, the number of particles increased and the generation of particles was promoted during the process of removing moisture contained in an alumite component. Further, from TMP1h to TMP24h in FIG. 6, moisture contained in the alumite component was further removed, and the generation of particles was further promoted.

By continuing to evacuate the vacuum chamber 51 using the TMP 40, the amount of moisture contained in the alumite component decreased, and as can be appreciated from TMP24h to TMP96h in FIG. 6, the number of particles generated decreased, indicating that the generation of particles was prevented.

Then, a dry gas was introduced into the vacuum chamber 51 to bring the pressure within the vacuum chamber 51 back to atmospheric pressure, and without opening/closing the lid 57, the vacuum chamber 51 was evacuated using the DP 53 and using the TMP 40 for 1 hour. It can be appreciated that although the number of particles was further reduced by evacuating the vacuum chamber 51 for 1 hour using the TMP 40, the number of particles was not substantially reduced.

Then, a dry gas was introduced into the vacuum chamber 51 to bring the pressure within the vacuum chamber 51 back to atmospheric pressure, the lid 57 was opened and closed (exposure step), the vacuum chamber 51 was evacuated using the DP 53 (third evacuation step), and the vacuum chamber 51 was further evacuated using TMP 40 for 1 hour (fourth evacuation step). By opening and closing the lid 57 in addition to bringing the pressure within the vacuum chamber 51 back to atmospheric pressure, the number of particles was reduced by more than one order of magnitude as compared with the number of particles measured 1 hour after starting evacuation using the TMP 40 in the pressure increasing step without opening and closing the lid 57.

In the example of FIG. 6, it was determined that the measured number of particles fell below the predetermined threshold value by evacuating the vacuum chamber 51 after opening and closing the lid 57. On the other hand, if it is determined that the measured number of particles does not fall below the predetermined threshold value, the process returns to the evacuation step, and the evacuation step, the pressure increasing step, and the exposure step are repeated until the measured number of particles falls below the predetermined threshold value. In this way, the amount of moisture in the vacuum chamber 51 can be adequately reduced, and the generation of particles from the alumite component can be more reliably prevented.

Note that in FIG. 4, the processes of steps S12 to S28 are repeated until it is determined that the measured number of particles is less than the threshold value. In this case, the third evacuation step may correspond to the first evacuation step, and the fourth evacuation step may correspond to the second evacuation step.

[Estimation Model of Particles Generated from Alumite Component]

Figure 7A:
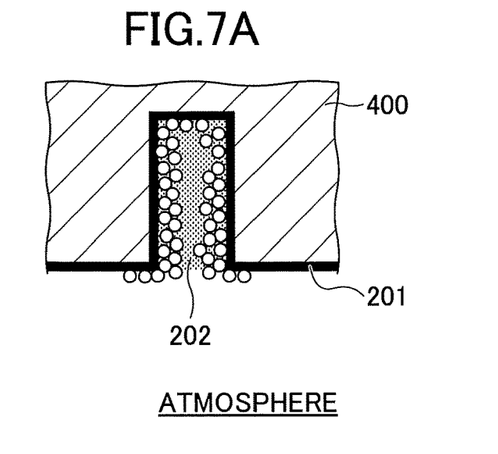
FIGS. 7A-7E are diagrams representing an estimation model of particle generation according to an embodiment of the present invention.

In the following, an estimation model of particles generated from an alumite component will be described with reference to FIGS. 7A-7E. FIGS. 7A-7E are diagrams representing an estimation model of particle generation according to an embodiment of the present invention. An alumite component 400 has an alumite layer and a fine hole 202 formed at the surface of the alumite layer that contains moisture and fine foreign matter (FIG. 7A).

Figure 7B:
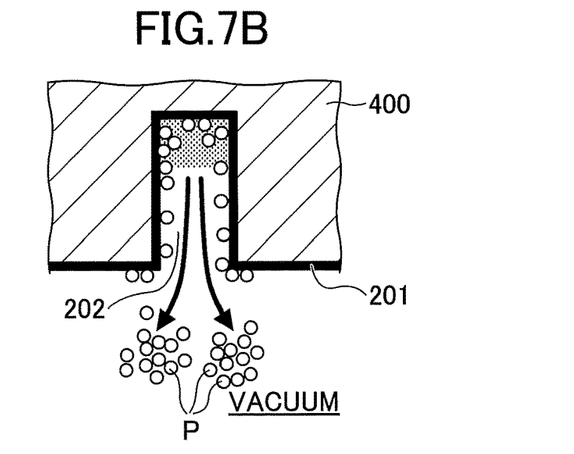

When the partial pressure of moisture in the vacuum chamber 51 decreases by evacuating the vacuum chamber 51 of the vacuum transfer module VTM using the TMP 40, the moisture in the fine hole 202 evaporates and is released into the vacuum chamber 51. At this time, the fine foreign matter in the fine hole 202 is discharged together with the moisture in the fine hole 202, and particles P are generated as a result (FIG. 7B). Accordingly, at the initial stage of evacuation (e.g., 1 hour after and 24 hours after starting evacuation in FIG. 6), the number of particles P increases. It has been confirmed that the main constituent of the particles P generated at this time is aluminum (Al). As such, it may be presumed that the fine foreign matter contained in the fine hole 202 is created from a fragile layer 201 formed on the surface of the alumite layer.

Figure 7C:
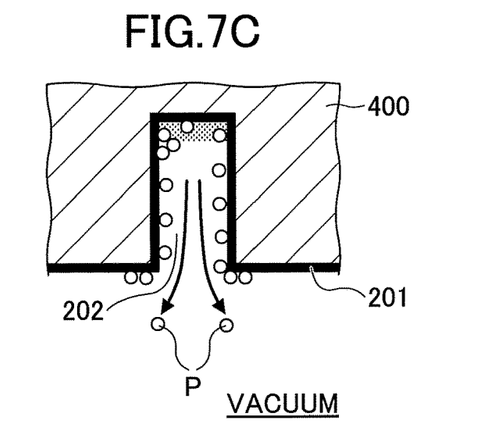
Figure 7D:
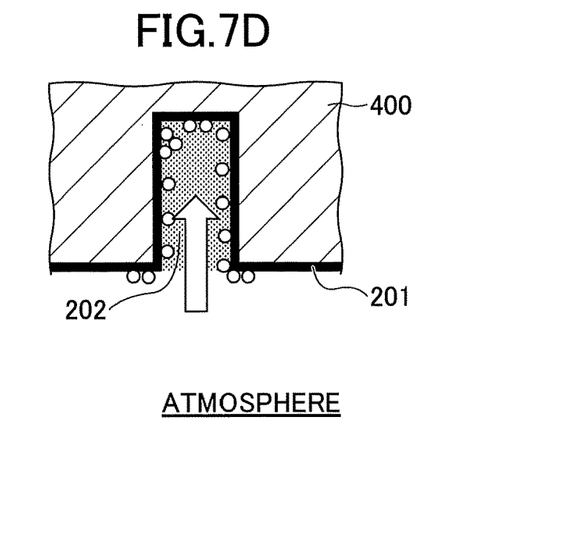

Further, when evacuation of the vacuum chamber 55 using the TMP 40 is continued (e.g., 48 hours and 96 hours after starting evacuation in FIG. 6), moisture in the fine hole 202 is further removed (FIG. 7C). As the amount of moisture decreases, the amount of foreign matter discharged together with the moisture also decreases such that the number of particles generated decreases. However, foreign matter continues to be discharged due to vibration of the vacuum chamber 51 and the like such that particles are still generated. Then, a dry gas is introduced into the vacuum chamber 51, the pressure within the vacuum chamber 51 is raised to atmospheric pressure, and the lid 57 is opened. As a result, the atmosphere outside the vacuum chamber 51 flows into the vacuum chamber 51, and the moisture contained in the atmosphere are reabsorbed in the fine hole 202 formed at the surface of the alumite layer (FIG. 7D).

Figure 7E:
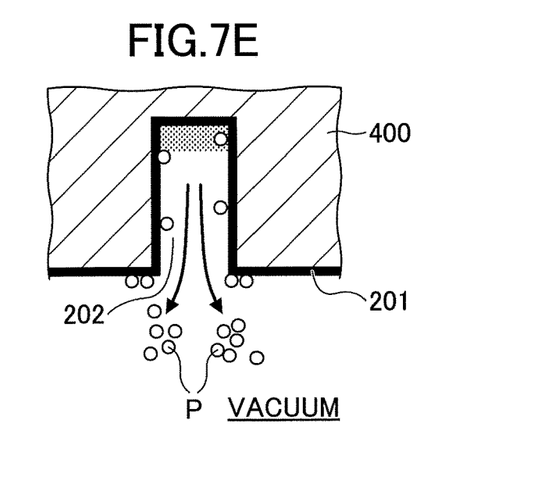

By evacuating the vacuum chamber 51 after causing reabsorption of moisture as described above, the fine foreign matter in the fine hole 202 can be discharged together with the moisture reabsorbed in the fine hole 202, and the fine foreign matter contained in the fine hole 202 can be sufficiently removed (FIG. 7E). In this way, the particles P generated from the fine hole 202 in the alumite layer surface may be substantially reduced.

Note that the particle generation preventing method according to the present embodiment may be applied to an unused vacuum apparatus before shipment or a vacuum apparatus that had an alumite component replaced with a new alumite component, for example. According to an aspect of the present embodiment, before performing wafer processing for the first time using a new vacuum apparatus or a new alumite component, moisture may be removed from the alumite component installed in the vacuum apparatus, and in the process of removing the moisture, particle generation can be promoted. In this way, even an unused vacuum apparatus can be prevented from generating particles and may be stably used like a vacuum apparatus that is already in use. As a result, a reduction in yield can be prevented and productivity can be improved.

Although the particle generation preventing method according to the present invention has been described above with reference to example embodiments, the present invention is not limited to the above-described embodiments and various modifications and changes may be made within the scope of the present invention. Also, the above-described embodiments may be implemented in combination to the extent practicable.

The particle generation preventing method according to an embodiment of the present invention is not limited to preventing the generation of particles in the vacuum chamber 51 of the vacuum transfer module VTM and may also be applied to the process module PM. In this way, particles generated from an alumite component used in the process module PM may be reduced.

Further, in the above-described embodiment, an exposure step of opening the lid and introducing the atmosphere containing moisture into the vacuum chamber is implemented to cause reabsorption of moisture. However, measures implemented to cause reabsorption of moisture are not limited to opening the lid. For example, because the relative humidity in a clean room is usually 40% to 50%, a gas containing 40% to 50% of moisture equivalent to the humidity of the clean room may be introduced into the vacuum apparatus to cause reabsorption of moisture without opening the lid. Further, a gas with a higher humidity of 50% to 100% may be supplied into the vacuum apparatus to promote efficient reabsorption of moisture in a short period of time, or the inner wall surface of the vacuum apparatus may be directly wiped with water to cause reabsorption of moisture, for example. Also, when increasing the pressure within the vacuum apparatus to atmospheric pressure, a gas containing moisture to be reabsorbed may be introduced, for example. Further, introduction of the gas containing moisture may be controlled by the control unit 100, for example. These are examples of the moisture adhesion step, and the exposing step is also an example of the moisture adhesion step.

The particle generation preventing method according to an embodiment of the present invention is not limited to being applied to an alumite component used in the vacuum transfer module VTM or the process module PM and may also be applied to an alumite component before assembly or an alumite component for other applications. In this way, particles generated from the alumite component may be reduced. For example, with respect to an alumite component before assembly, the particle generation preventing method according to the present embodiment may be executed with an arbitrary vacuum apparatus to reduce particles generated from the alumite component, and the alumite component may be assembled into an apparatus thereafter.

Also, after operating the TMP 40 in the above-described embodiment, a cryopump may be used or a heating method may be used to accelerate moisture removal and thereby accelerate the reduction of particles, for example. By using a cryopump or the above method, the partial pressure of moisture in the vacuum chamber 51 can be reduced, and the continuous evacuation time for continuously evacuating the vacuum chamber 51 may be reduced.

Also, note that the process module PM and the vacuum transfer module VTM are examples of a vacuum apparatus including an alumite-treated component, and the particle generation preventing method according to an embodiment of the present invention may be used in an evacuation system that can maintain the internal pressure within a vacuum apparatus at 1 mTorr or less, for example.

When the vacuum apparatus according to an embodiment of the present invention is implemented by the process module PM, the process module PM may be a capacitively coupled plasma (CCP) apparatus, an inductively coupled plasma (ICP) apparatus, a plasma processing apparatus using a radial line slot antenna, a helicon wave plasma (HWP) apparatus, an electron cyclotron resonance (ECR) plasma apparatus, or the like. Also, the process module PM may be a plasma-less apparatus that performs etching and film deposition processes using a reactive gas and heat, for example.

Also, in the present specification, a wafer has been described as an example of a substrate to be processed. However, the substrate to be processed may be various other types of substrates such as substrates used in an LCD (Liquid Crystal Display), an FPD (Flat Panel Display), and the like, a photomask, a CD substrate, and a printed circuit board, and the like.

What is claimed is:

1. A particle generation preventing method for preventing particle generation in a vacuum apparatus including an alumite-treated component, the particle generation preventing method comprising:
   an evacuation step of evacuating the vacuum apparatus to reduce a pressure within the vacuum apparatus to less than or equal to $1.3 \times 10^{-1}$ Pa (1 mTorr);
   a pressure increasing step of increasing the pressure within the vacuum apparatus to atmospheric pressure after the evacuation step; and
   a moisture adhesion step of causing moisture to adhere to the alumite-treated component after the pressure increasing step.

2. The particle generation preventing method according to claim 1, wherein
   the vacuum apparatus is a transfer module of a semiconductor manufacturing apparatus; and
   the evacuation step includes
      a first evacuation step of evacuating the transfer module using a first pump provided in the transfer module;
      a first opening step of opening a gate valve provided between a substrate process module and the transfer module; and
      a second evacuation step of evacuating the transfer module using a second pump provided in the substrate process module.

3. The particle generation preventing method according to claim 2, wherein the second evacuation step is performed for at least one hour.

4. The particle generation preventing method according to claim 2, wherein the first pump is a dry pump and the second pump is a turbo molecular pump.

5. The particle generation preventing method according to claim 2, further comprising:
   a third evacuation step of evacuating the transfer module using the first pump provided in the transfer module after the moisture adhesion step.

6. The particle generation preventing method according to claim 5, further comprising:
   a second opening step of opening the gate valve provided between the substrate process module and the transfer module after the third evacuation step; and a fourth evacuation step of evacuating the transfer module using the second pump provided in the substrate process module.

7. The particle generation preventing method according to claim 1, wherein
the moisture adhesion step includes opening a lid of the vacuum apparatus and exposing an interior of the vacuum apparatus to an atmosphere.

8. The particle generation preventing method according to claim 1, wherein
the moisture adhesion step includes introducing a gas containing moisture into the vacuum apparatus.

9. The particle generation preventing method according to claim 1, wherein
the pressure increasing step includes introducing a dry gas into the vacuum apparatus, the dry gas being any one of dry air, nitrogen gas, and a rare gas.

10. The particle generation preventing method according to claim 1, wherein the vacuum apparatus is an unused vacuum apparatus before shipment or a vacuum apparatus that had the alumite-treated component replaced.

11. The particle generation preventing method according to claim 1, wherein the alumite-treated component is an inner wall of the vacuum apparatus.

12. A vacuum apparatus comprising:
an alumite-treated component; and
a control unit configured to implement control to
evacuate the vacuum apparatus to reduce a pressure within the vacuum apparatus to less than or equal to $1.3 \times 10^{-1}$ Pa (1 mTorr); and
introduce a gas containing moisture into the vacuum apparatus to increase the pressure within the vacuum apparatus to atmospheric pressure after evacuating the vacuum apparatus.

13. A vacuum apparatus comprising:
an alumite-treated component; and
a control unit configured to implement control to
evacuate the vacuum apparatus to reduce a pressure within the vacuum apparatus to less than or equal to $1.3 \times 10^{-1}$ Pa (1 mTorr);
introduce a dry gas into the vacuum apparatus to increase the pressure within the vacuum apparatus to atmospheric pressure after evacuating the vacuum apparatus; and
open a lid of the vacuum apparatus after increasing the pressure within the vacuum apparatus.

\* \* \* \* \*